United States Patent
Burk, Jr. et al.

Patent Number: 5,954,881
Date of Patent: Sep. 21, 1999

[54] CEILING ARRANGEMENT FOR AN EPITAXIAL GROWTH REACTOR

[75] Inventors: Albert A. Burk, Jr., Murrysville; Linard M. Thomas, Saltsburg, both of Pa.

[73] Assignee: Northrop Grumman Corporation, Los Angeles, Calif.

[21] Appl. No.: 08/789,769

[22] Filed: Jan. 28, 1997

[51] Int. Cl.⁶ .................................................. C23C 16/00
[52] U.S. Cl. .......................................... 118/715; 118/725
[58] Field of Search ....................................... 118/715, 725

[56] References Cited

U.S. PATENT DOCUMENTS 3,641,974 2/1972 Yamada ..................................... 118/725
3,696,779 10/1972 Murai ....................................... 118/725

*Primary Examiner*—Richard Bueker
*Attorney, Agent, or Firm*—Walter G. Sutcliff

[57] ABSTRACT

A ceiling arrangement for a high temperature epitaxial growth reactor in which silicon carbide epitaxial layers may be grown. The ceiling includes an upper layer of carbon foam and a lower layer of graphite bonded thereto. A support structure for the ceiling is coupled to a nozzle assembly, holding a gas delivering nozzle. The support structure has a lower flange portion which includes an upwardly extending projection defining a knife edge upon which the ceiling rests. The arrangement minimizes unwanted heat transfer from the ceiling to the nozzle assembly and nozzle.

12 Claims, 4 Drawing Sheets

5,954,881

CEILING ARRANGEMENT FOR AN EPITAXIAL GROWTH REACTOR

BACKGROUND OF THE INVENTION

1. Field of the Invention

The invention in general relates to semiconductor epitaxial layer growth, and more particularly to a ceiling for a growth reactor capable of growing silicon carbide semiconductors layers.

2. Description of Related Art

Silicon carbide is being used extensively as a semiconductor material for various electronic applications. Silicon carbide is a wide bandgap semiconductor with desirable material properties including high breakdown field strength 10 times larger, and thermal conductivity 3 times larger than conventional semiconductor materials. Accordingly, semiconductor devices of silicon carbide have the ability to operate at higher voltages and temperatures than conventional silicon or gallium arsenide devices thus providing for higher power devices with reduced cooling requirements that operate from dc to microwave frequencies.

Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

In one popular process for the fabrication of a silicon carbide semiconductor device, thin epitaxial layers of silicon carbide are deposited by an epitaxial technique known as vapor phase epitaxy, a special case of the more general chemical vapor deposition. In vapor phase epitaxy the crystal structure and polytype of a relatively thick substrate is reproduced, but with higher purity and crystalline quality than the substrate. In addition, intentional impurity atoms of a dopant are added as desired to produce numerous layers with tailored conductivity and carrier type.

The epitaxial layers are grown in a device known as a reactor. In one well known type of reactor used for growing epitaxial layers of III–V compounds, such as gallium arsenide, a plurality of wafer substrates may be accommodated by a graphite susceptor located below a ceiling member having a central aperture through which various gases are supplied by a nozzle. The wafers are rotated as the susceptor is rotated during the deposition process. Typical reactor temperature during epitaxial deposition is approximately 800° C. for the III–V compounds and 1200° C. for silicon. To grow epitaxial layers of silicon carbide, however, requires much higher temperatures, in the range of 1450–1700° C., and at these temperatures conventional reactor ceilings tend to adversely affect the growth process or even catastrophically fail.

The present invention provides for a ceiling design that will allow for III–V compounds or silicon epitaxial growth as well as higher temperature silicon carbide epitaxial growth.

SUMMARY OF THE INVENTION

An improved ceiling arrangement is provided for an epitaxial growth reactor having a susceptor upon which wafers are placed for receiving epitaxial layer deposition by means of predetermined gases provided through a nozzle assembly.

The arrangement includes a ceiling having a central aperture through which passes the nozzle assembly as well as a ceiling support structure which is coupled to the nozzle assembly. The ceiling support structure has a lower flange portion that includes an upwardly extending projection upon which the ceiling is supported. To minimize heat transfer to the nozzle assembly, the projection is a knife edge which forms minimal contact with the ceiling.

The ceiling itself is a multilayer structure having a relatively thick upper layer of carbon foam and a relatively thinner bottom layer of graphite which is preferably bonded to the carbon foam. In order to tailor the chemical behavior of the ceiling, the graphite may be coated with a high temperature material.

DESCRIPTION OF THE PREFERRED EMBODIMENT

Figure 1:
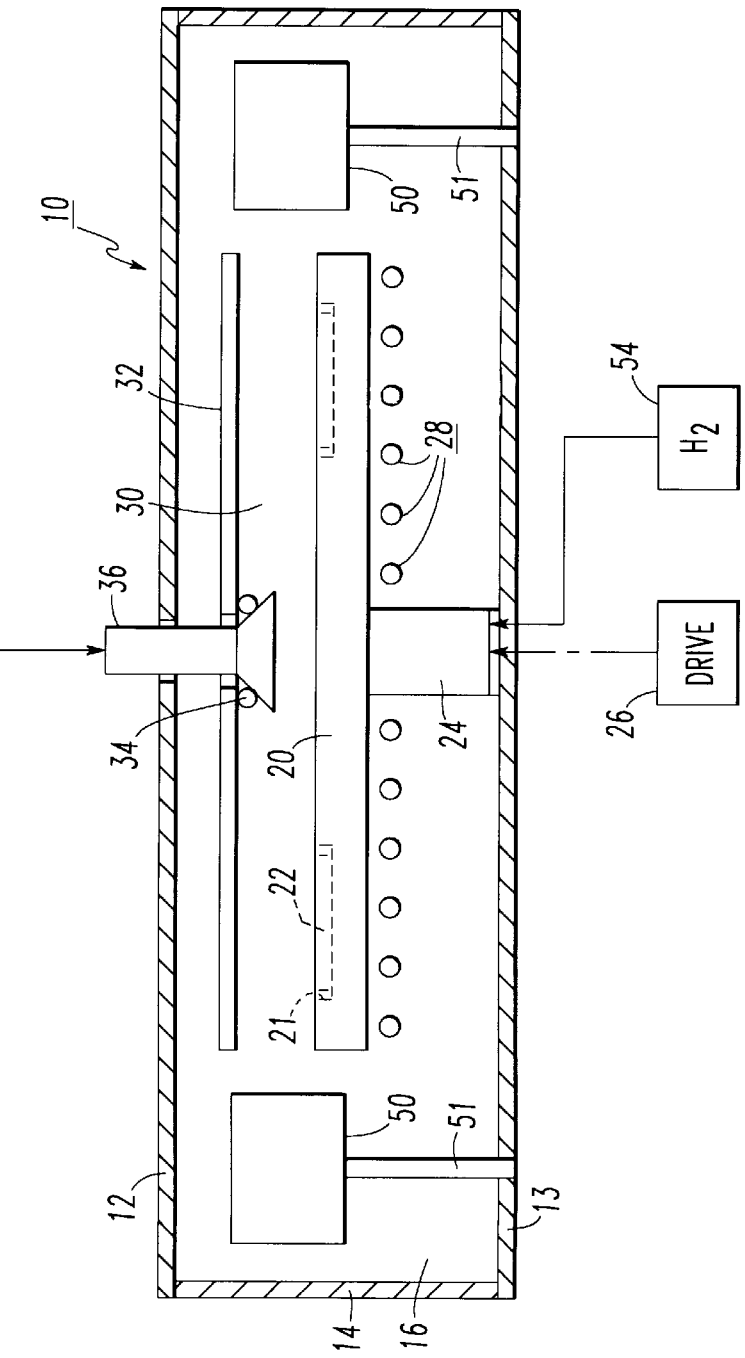
FIG. 1 is a schematic illustration of a vapor phase epitaxial growth reactor.

In FIG. 1 there is illustrated a vapor phase epitaxial growth reactor 10 having a top 12, a bottom 13 and side wall portions 14, to define an interior chamber 16. Disposed within the chamber 16 is a susceptor assembly 20 having a plurality of cavities 21 therein each for accommodating a respective wafer holder 22.

The susceptor assembly is coupled to, and rotated by, a support 24 which is rotatable about a central axis by means of a drive mechanism 26, located outside of the chamber 16. Disposed below the susceptor assembly 20 is a heat source such as an r.f. heating coil arrangement 28 operable to establish the required temperature for silicon carbide growth within a reaction zone 30.

The reaction zone 30 is located between the upper surface of the susceptor assembly and a reaction zone ceiling 32, maintained in position by means of a ceiling ring 34. Passing through the ceiling 30 and ring 34 is a nozzle 36 for supplying various gases utilized in the growth process.

These gases are provided by a gas supply 40 and may include, by way of example for silicon carbide epitaxial growth, a carrier gas 41 such as hydrogen, a source of silicon such as silane 42, a source of carbon such as propane 43, an etchant such as hydrogen chloride 44, and various dopant gases D1 to Dn.

The various gases provided to the reaction zone 30 are thereafter removed by means of an annular gas collector 50 which discharges the spent gases through conduits 51 to a location outside of the chamber 16.

During the deposition process, the susceptor assembly rotates by virtue of its coupling to rotatable support 24 and during this rotation a levitating gas, such as hydrogen, from source 54 is supplied through support 24 to gas passageways within the susceptor assembly 20 to cause rotation of the individual wafer holders 22.

Figure 2A:
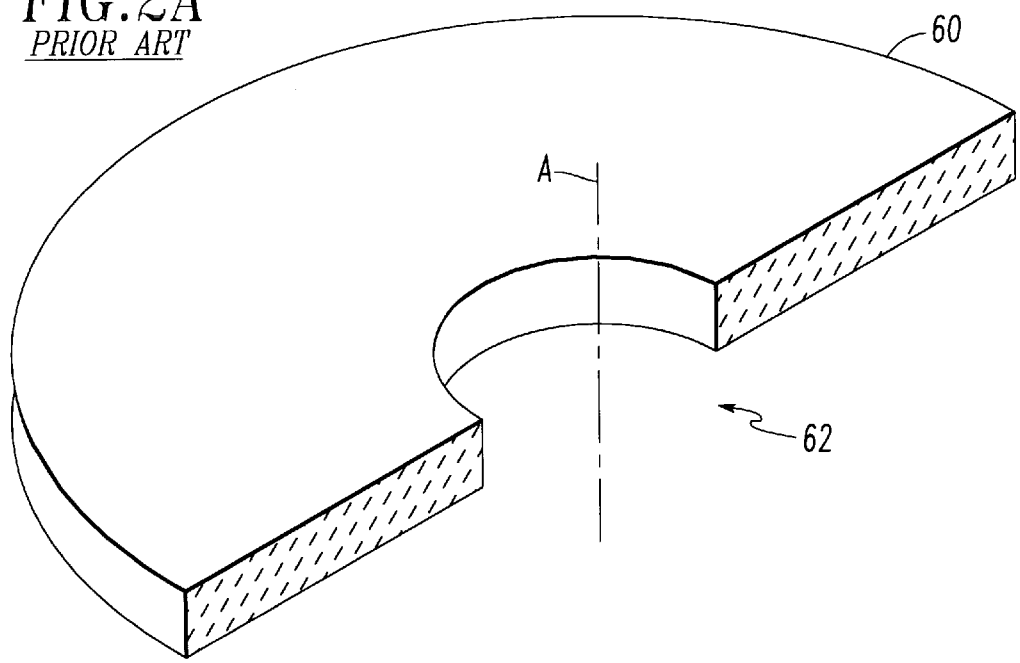
FIGS. 2A and 2B are isometric cross-sectional views of prior art ceiling designs.
Figure 2B:
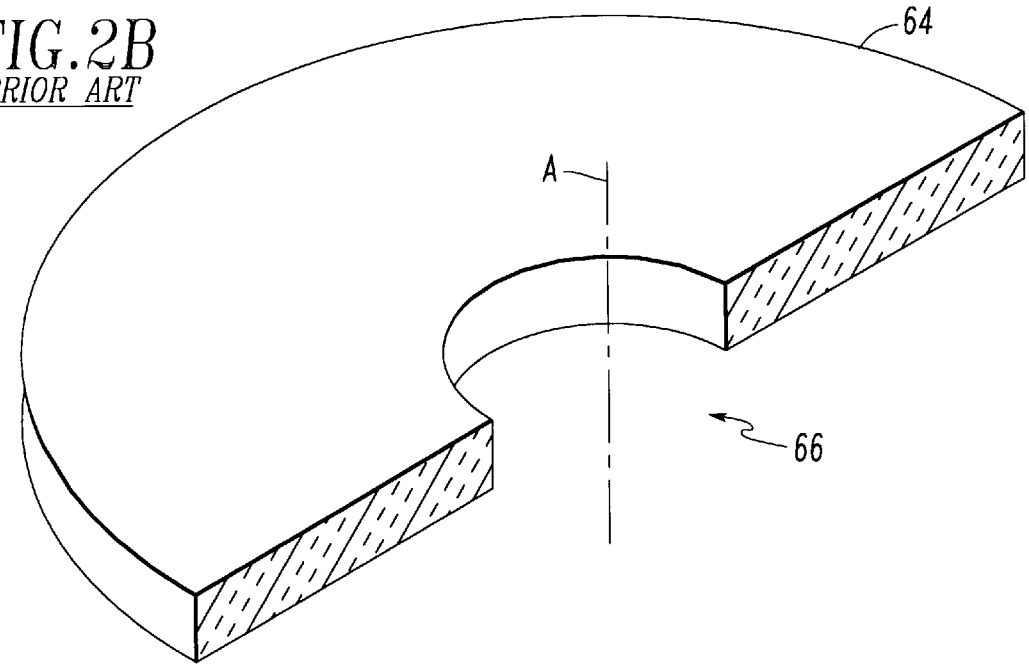

FIGS. 2A and 2B respectively illustrate two of various ceilings which are commonly used or suggested for use in reactors such as depicted in FIG. 1. In FIG. 2A, ceiling 60, which is made of pure quartz is symmetrical about a central longitudinal axis A and includes a central aperture 62 through which passes a nozzle assembly (not shown). Although quartz has a desired low thermal conductivity and is very stable from a chemical stability standpoint, it lacks sufficient high thermal shock resistance for use in growing silicon carbide epitaxial layers.

More particularly, if operated at temperatures of around 600° C., one of the reagents used for silicon carbide growth, silane, decomposes and deposits silicon on the relatively cool quartz ceiling instead of on the intended wafers below. This is due to the supersaturation near the ceiling because of its low temperature. This unwanted deposition severely limits the intended epitaxial growth rate. If the ceiling temperature is increased to around 1000° C. or higher, unwanted ceiling deposits are reduced or eliminated. Operation at these elevated temperatures however results in catastrophic breakage of the ceiling.

FIG. 2B is representative of another type of ceiling. The ceiling 64, having a central aperture 66 is made of carbon foam, a commercially available material. Carbon foam exhibits excellent thermal qualities for high temperature use. As a carbon foam ceiling is heated to elevated temperatures, primarily by radiation from the susceptor, thermal losses from the ceiling to other parts of the reactor, some of which are water cooled, must be minimized. Carbon foam has low thermal conductivity ~0.5 watts per meter degree kelvin) for this purpose. Although thermal requirements are satisfied with the use of carbon foam it tends to impart undesired impurities contained in the carbon, particularly p-type impurities such as aluminum and boron, into the growth process. This is magnified in view of the extremely large surface area associated with a foam material.

Figure 3:
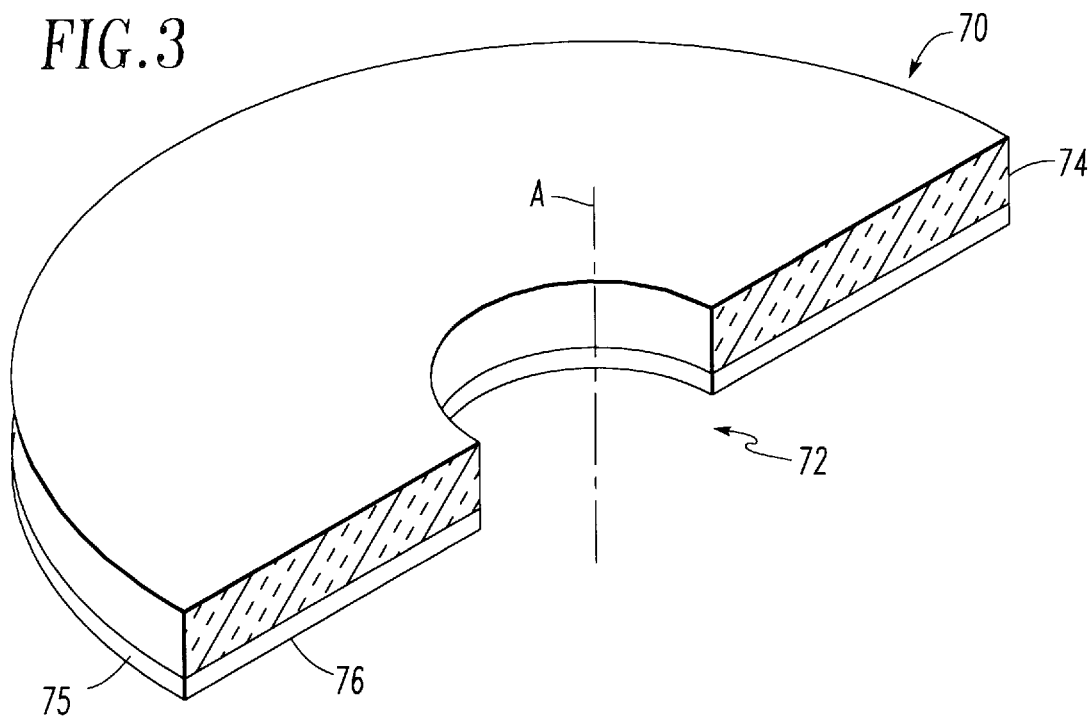
FIG. 3 is an isometric cross-sectional view of a ceiling in accordance with one embodiment of the invention.

An improved ceiling in accordance with the present invention which obviates the deficiencies of the prior art ceilings, is illustrated in FIG. 3. The ceiling 70 is symmetrical about a central longitudinal axis A and includes a central aperture 72 which will fit up over a nozzle assembly. Ceiling 70 is of a multilayer construction and includes a relatively thick upper layer 74 of a carbon foam and a relatively thinner bottom layer 75 made of pure graphite, preferably bonded to layer 74. This multilayer structure is a commercially available item typically used for furnace linings by way of example.

In the present arrangement the carbon foam layer 74 provides the required thermal insulation while the graphite bottom layer 75 provides the necessary purity and chemical resistance to the highly reactive gases used or generated in the growth process. The bottom layer 75 also shields the carbon foam upper layer 74 from the reaction zone below the layer 75 to reduce or eliminate the undesired deposition of the aforementioned impurities.

By way of example for a circular ceiling with a diameter of 280 mm and a central aperture diameter of 93 mm, the thickness of the carbon foam layer 74 may be around 5.6 mm and the thickness of the graphite layer 75 may be around 0.4 mm. Use of a thick, for example 3 to 4 mm, graphite stand alone ceiling, that is, without the carbon foam upper layer, results in a ceiling which is too thermally conductive (about 220 W/MK axially and 7 W/MK radially) which might result in damage to the cooled components. Moreover, tests with such a ceiling resulted in warped ceilings as well as delaminated ceilings within a single growth run.

Figure 4:
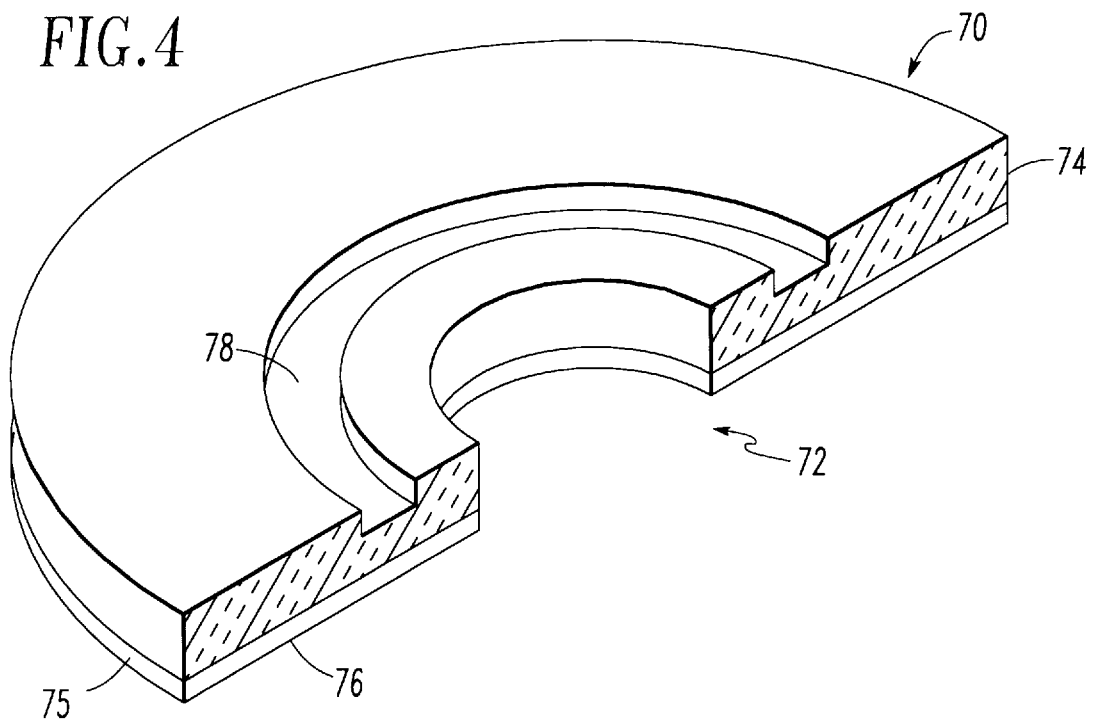
FIG. 4 is an isometric cross-sectional view of a ceiling in accordance with another embodiment of the invention.

With the multilayer construction of carbon foam and graphite, each thickness and thickness ratio, as well as the carbon foam density, may be varied to suit the particular process temperatures desired. The bottom layer 75 may also be provided with a deposited high temperature coating 76 such as silicon, silicon carbide or tantalum carbide, by way of example, to tailor the chemical behavior of the ceiling material. In addition, and as illustrated in FIG. 4, a circular groove 78 may be formed around 360° in the upper carbon foam layer 74 to control heat transport laterally toward the central aperture 72.

Figure 5:
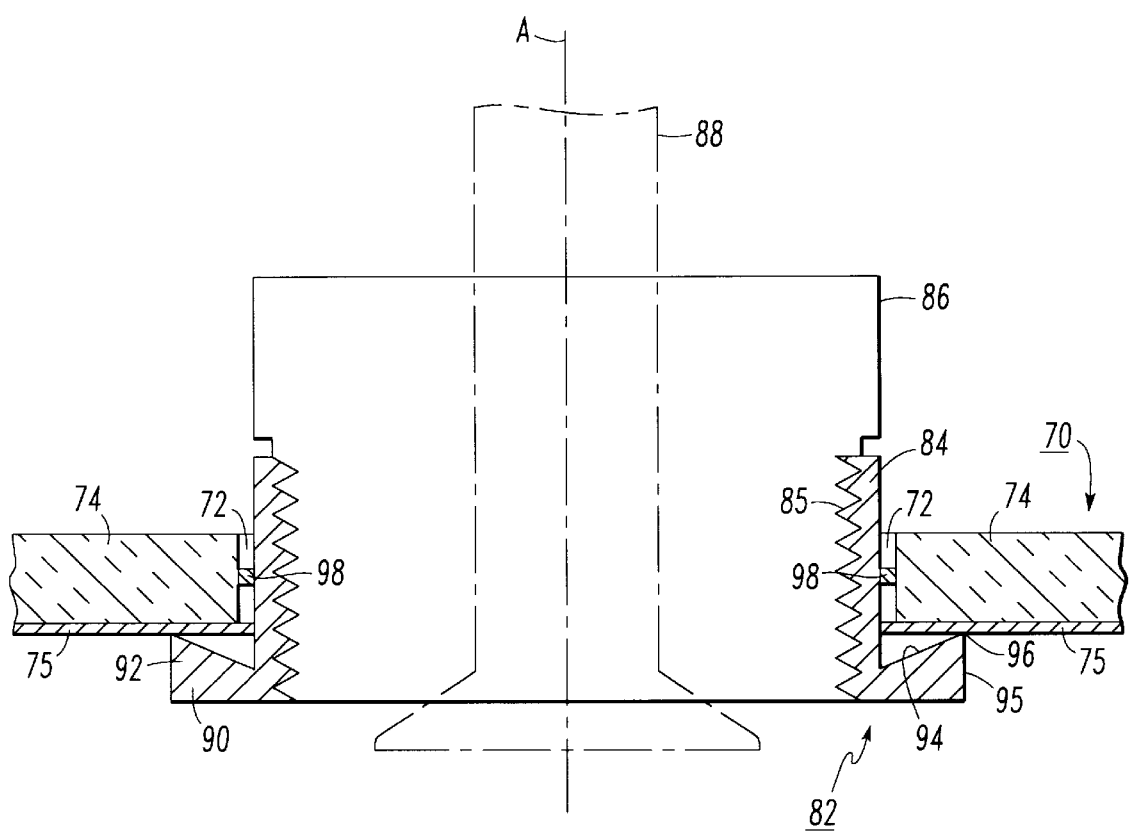
FIG. 5 is a view, partially in section, illustrating the support for the improved ceiling.

FIG. 5 illustrates a ceiling support structure which not only minimizes heat transfer to a nozzle assembly, but also provides an effective gas seal to the bottom of the ceiling. The ceiling support structure 82, coaxial with the central longitudinal axis A and shown in an axial cross section, has a cylindrical body 84 with internal threads 85 for coupling with a nozzle assembly 86. For the operating temperatures encountered in the growth process it is preferred that the ceiling support structure 82 be made of molybdenum to prevent melting thereof. The nozzle assembly is water cooled and is a means for supporting a water cooled gas delivering nozzle 88, shown in phantom view.

The ceiling support structure 82 includes a lower flange portion 90 having an upwardly extending projection 92, both of which circumferentially surround the cylindrical body 84. In the axial cross sectional view it is seen that two surface lines 94 and 95 meet at an acute angle so as to define a knife edge 96. The ceiling 70 rests on this knife edge 96 which provides an effective gas seal to the bottom of ceiling 70. The knife edge 96 also presents minimal contact area, and accordingly, minimum unwanted heat transfer from the hot ceiling to the relatively cool nozzle assembly and nozzle, via the ceiling support structure 82.

Another potential source of unwanted heat transfer may occur if the vertical surface around aperture 72 of ceiling 70 contacts the cylindrical body 84 of ceiling support structure 82. Accordingly, there is provided a series of small protrusions or standoffs 98 around body 84 to prevent this contact.

Although the present invention has been described with a certain degree of particularity, it is to be understood that various substitutions and modifications may be made without departing from the spirit and scope of the invention as defined in the appended claims.

What is claimed is:

1. An improved ceiling arrangement for an epitaxial growth reactor having a susceptor upon which wafers are placed for receiving epitaxial layer deposition by means of predetermined gases supplied through a nozzle assembly, comprising:
   (A) a ceiling having a central longitudinal axis and a central aperture through which said nozzle assembly passes;
   (B) a ceiling support structure coaxial with said central longitudinal axis and being coupled to, and surrounding said nozzle assembly;
   (C) said ceiling support structure passing through said aperture and having a lower flange portion, with said flange portion including an upwardly extending projection;
   (D) said ceiling being supported on and by said projection.

2. An arrangement according to claim 1 wherein:
   (A) said ceiling is comprised of a relatively thick layer of carbon foam and a relatively thin layer of graphite bonded to the undersurface thereof.

3. An arrangement according to claim 2 wherein:
   (A) said ceiling support structure is made of molybdenum.

4. An arrangement according to claim 1 wherein:

(A) said ceiling support structure includes a cylindrical body; and wherein (B) said flange portion and said projection circumferentially surround said cylindrical body.

5. An arrangement according to claim 1 wherein:

(A) any axial cross section through said projection includes first and second surface lines which meet at an acute angle so as to define a knife edge.

6. An arrangement according to claim 4 wherein:

(A) said cylindrical body includes a plurality of standoffs for preventing contact of said ceiling with said cylindrical body.

7. An arrangement according to claim 4 wherein:

(A) said cylindrical body includes internal threads; and (B) said coupling is by threaded engagement with said nozzle assembly.

8. An arrangement according to claim 2 wherein:

(A) the underside of said ceiling includes a predetermined coating deposited on said graphite.

9. An arrangement according to claim 8 wherein:

(A) said coating is selected from the group including silicon, silicon carbide and tantalum.

10. An arrangement according to claim 1 wherein:

(A) said ceiling includes a groove in the top portion thereof to reduce lateral heat transfer.

11. An arrangement according to claim 10 wherein:

(A) said ceiling is circular; and (B) said groove is positioned 360° around said central aperture.

12. An improved ceiling arrangement for an epitaxial growth reactor having a susceptor upon which wafers are placed for receiving epitaxial layer deposition by means of predetermined gases supplied through a nozzle assembly, comprising:

(A) a ceiling having a central longitudinal axis and a central aperture through which said nozzle assembly passes;

(B) said ceiling having at least two layers, one of said layers being of carbon foam, another of said layers being of graphite; and (C) means for supporting said ceiling.

\* \* \* \* \*